United States Patent
Doherty et al.

(10) Patent No.: US 6,914,197 B2
(45) Date of Patent: Jul. 5, 2005

(54) FLEXIBLE CIRCUIT BOARD FOR TABLET COMPUTING DEVICE

(75) Inventors: John Doherty, Austin, TX (US); Todd W. Steigerwald, Austin, TX (US); Jefferson Blake West, Austin, TX (US); Philip Leveridge, Austin, TX (US); David Altounian, Austin, TX (US); David Cutherell, Austin, TX (US)

(73) Assignee: Motion Computing, Inc., Austin, TX (US)

( * ) Notice: Subject to any disclaimer, the term of this patent is extended or adjusted under 35 U.S.C. 154(b) by 0 days.

(21) Appl. No.: 10/756,926

(22) Filed: Jan. 14, 2004

(65) Prior Publication Data

US 2004/0188133 A1 Sep. 30, 2004

Related U.S. Application Data

(62) Division of application No. 10/175,581, filed on Jun. 19, 2002.

(51) Int. Cl.⁷ ............................................... H05K 1/00
(52) U.S. Cl. ...................... 174/254; 361/683; 361/749
(58) Field of Search ............................... 174/254, 72 R, 174/72 A, 71 B, 52.2, 52.3, 52.4; 361/683, 686, 750, 751; 710/303, 304

(56) References Cited

U.S. PATENT DOCUMENTS

| | | | |
|---|---|---|---|
| 4,815,984 A | * | 3/1989 | Sugiyama et al. ........... 439/211 |
| 5,032,737 A | * | 7/1991 | Holm et al. .................. 307/9.1 |
| 5,130,499 A | * | 7/1992 | Dijkshoorn .................. 174/254 |
| 5,133,076 A | | 7/1992 | Hawkins et al. |
| 5,329,289 A | | 7/1994 | Sakamoto et al. |
| 5,436,792 A | | 7/1995 | Leman et al. |
| 5,460,530 A | * | 10/1995 | Toba et al. .................... 439/34 |
| 5,552,957 A | | 9/1996 | Brown et al. |
| 5,619,397 A | | 4/1997 | Honda et al. |
| 5,668,570 A | | 9/1997 | Ditzik |
| 5,832,080 A | | 11/1998 | Beutler et al. |
| 5,859,762 A | | 1/1999 | Clark et al. |
| 5,899,421 A | | 5/1999 | Silverman |
| 6,173,933 B1 | | 1/2001 | Whiteside et al. |
| 6,195,254 B1 | * | 2/2001 | Chang ........................ 361/681 |
| D439,908 S | | 4/2001 | Gozani |
| 6,282,082 B1 | | 8/2001 | Armitage et al. |
| 6,594,146 B2 | | 7/2003 | Frangesch et al. |
| 6,665,191 B2 | * | 12/2003 | Blood et al. ................. 361/749 |

FOREIGN PATENT DOCUMENTS

| | | |
|---|---|---|
| EP | 0 581 286 A1 | 7/1993 |
| JP | 9251328 A | 9/1997 |
| JP | 10154041 A | 6/1998 |
| WO | WO 01/84729 A1 | 11/2001 |

OTHER PUBLICATIONS

PCT Search Report dated Aug. 5, 2004.

* cited by examiner

Primary Examiner—Kamand Cuneo
Assistant Examiner—Ishwar (I. B.) Patel
(74) Attorney, Agent, or Firm—Fortkort Grether + Kelton LLP

(57) ABSTRACT

The present invention provides a tablet computer and a docking station assembly. This docking station includes a docking assembly for positioning with three degrees of freedom and having a data connector for mechanically supporting and interfacing with the tablet computer. A support member couples the docking assembly to an expansion base. The base includes a number of ports for interfacing with a variety of peripheral devices or power supplies. These varieties of ports mount to a printed circuit board contained within the expansion base. A flexible printed circuit (FPC) combines the signal pathways for the variety of ports, allowing the signal pathways to travel from the printed circuit board and to the data connector. The tablet computing device has a plurality of contact or touch points positioned on the right and left edges of the tablet to facilitate aligning the tablet to the docking assembly in either a landscape or portrait mode.

9 Claims, 15 Drawing Sheets

FLEXIBLE CIRCUIT BOARD FOR TABLET COMPUTING DEVICE

RELATED APPLICATIONS

This application is a divisional of application Ser. No. 10/175,581, filed on Jun. 19, 2002, and entitled "Table Computing Device with three-Dimensional Docking Support. This application is related to and incorporates herein by reference the following U.S. patent applications: U.S. Utility patent application Ser. No. 10/175,582, entitled "A System and Method of Carrying, Protecting and Displaying a Tablet Computer", filed Jun. 19, 2002, by John Doherty et al.; U.S. Design patent application Ser. No. 29/162,680, entitled "An Expansion Base That Can Be Articulated in Three-Dimensions", filed Jun. 19, 2002, by John Doherty et al.; and U.S. Design patent application Ser. No. 29/162,700, entitled "Tablet Computer", filed Jun. 19, 2002, by Chris Cavello et al.

TECHNICAL FIELD OF THE INVENTION

The present invention relates generally to interfacing personal computer systems, and in particular to tablet computing devices with docking stations. More particularly, the present invention relates to the manner and techniques by which tablet devices interface with docking stations in three-dimensional space.

BACKGROUND OF THE INVENTION

Mobile workers need access to information and communications. Existing PDA and notebook clamshell implementations are not appropriate for all environments. Field engineers, surveyors, sales representatives, students, and healthcare professionals are just a few of the professionals that can benefit from an improved platform.

These particular customers have often experienced an industrial pen computing device, and are interested in devices with broader functionality to eliminate the need for two computers—a 'real' one at the office and a small form factor product in the field. To replace the 'real' one, any primary computing device must be able to run most Windows applications as well as legacy applications.

As laptops have become more powerful, they have become in part a solution to the two-computer problem. However, laptops do not address all the ergonomic and environmental concerns to become a true solution.

Most laptop computer systems are designed to connect to a docking station, also known as an expansion base. An expansion base is not actually a part of the laptop computer system per se, but is a separate unit that accommodates the laptop. The laptop electrically connects to the expansion base. Because of inherent size and weight restrictions, laptop computers tend to require design tradeoffs such as small keyboards and graphics displays, crude tracking devices, and a limited number of mass storage devices. Expansion bases may include peripheral devices, such as a DVD ROM drive and a keyboard, turning the laptop computer into a desktop system. Accordingly, laptop users can access valuable features such as additional peripheral components including a large graphics display, a traditional mouse and full-size keyboard, hard and floppy disk drives, CD ROM drives, Digital Video Disk (DVD) drives, and other peripheral components. An expansion base may offer connections to local area network (LAN), printers, and modems. Although intended primarily for desktop operation, the utilization of expansion bases has greatly enhanced the usability and comfort of laptop computer systems, especially when the laptop is used frequently in one location, such as in the home or office.

Despite the apparent advantages an expansion base can offer to many laptop computer systems, docking a laptop to such a device often results in conflicts between the expansion base and the laptop required. As a result, the computer users must shutdown and restart their laptop. Often taking several minutes. To date, no one has designed a computer system that overcomes these deficiencies.

It would be desirable to have a functional ergonomic, environmentally sound, plug and play computing device that eliminates the need for shutting down and restarting the computer.

Furthermore, it would be advantageous to use an environmentally hardened touch screen or input pen to eliminate the need for a keyboard, thus allowing the computing device to serve as a work surface.

Finally, it would also be advantageous to be able to couple a plug-and-play computing device to an expansion base in any orientation, thus allowing the device to surface as a functional computer tablet that can be oriented in either a landscape or portrait mode.

SUMMARY OF THE INVENTION

Accordingly, a technical advantage of the present invention is its an improved expansion base or docking station. Furthermore, it is another object to provide a three dimensional docking station that is simple to construct and economical to manufacture.

Another technical advantage of the present invention is a docking station that prevents the incorrect disengagement of the portable computer from the docking station while allowing the portable computer to be repositioned in three dimensions.

To achieve these and other technical advantages, the present invention provides a tablet computer using a lightweight housing having an input port and various touch points for interfacing and supporting the tablet computer.

A docking station receives the tablet computer. This docking station includes a docking assembly operable to be positioned with three degrees of freedom, bearing a data connector that mechanically supports and interfaces with the tablet computer. A support member couples the docking assembly to the expansion base, wherein the base comprises a plurality of ports that can interface with a variety of peripheral devices or power supplies. These various ports are mounted to a printed circuit board contained within the expansion base. A flexible printed circuit (FPC) combines the signal pathways for the variety of ports, allowing the signal pathways to travel from the printed circuit board and to the data connector. A plurality of contact or touch points positioned on the right and left edges of the tablet facilitate aligning the tablet to the docking assembly in either a landscape or portrait mode.

The docking assembly attaches to the base assembly by two joints attached to the support member. In one embodiment, the joint has a hinge and the joint comprises a rotating socket wherein the two joints allow the docking assembly to move in three dimensions with respect to the base. The FPC is routed through the first joint and said second joint.

To secure the tablet computer, the docking assembly provides a channel which receives the computing tablet to prevent the tablet from moving in the local Z direction with respect to the docking assembly. The overall shape of the docking assembly forms an "L", "J", or "U" shape, wherein an upright channel of the "L", "J", or "U" shape receives an upright edge of the tablet device, when the device is operated in a landscape mode. A horizontal channel receives a lower edge of the tablet device when in a landscape mode.

In certain embodiments the tablets display reorients as the docking assembly rotates. This may be based on rotation past a predetermined angle such as 90°. Furthermore, the reorientation may be automatic in nature. Additionally, a user may direct the table to reorient the display when a function key on the tablet is activated.

The present invention provides a significant advantage by allowing the tablet to be positioned in three dimensions without placing tearing or twisting stresses on the signal pathways.

This is achieved through the use of FPC, wherein several signals are mapped to one FPC. Separation zones within the FPC prevent cross-contamination of the signals FPC. These signals may include: DC power, AC power, VGA, USB, analog audio, digital audio, analog video, digital video, LAN, WAN, and IEEE 1394 or other signals known to those skilled in the art.

The tablet computer associated with the present invention provides a full computing platform with options for pen and audio input characteristics. This tablet computer provides a portable, non-intrusive, instantly available, plug-and-play platform capable of running applications without requiring a keyboard. This platform provides a powerful computing platform to be used for presentations, in meeting, reading and editing documents, or for use as an electronic book or notepad.

The tablet computer provides a most capable mobile computing device, having long battery life, thin ergonomic designs, optional wireless capability, and a lightweight form factor.

One embodiment runs a specialized version of Microsoft's Windows XP operating system. This version has all of the features of Windows XP Professional with additional features specific to the Tablet computing environment. This allows all existing Windows software applications to run on this computing platform.

This computing platform adds functionality for users to run Windows or other like OSS and their applications using a pen, annotate documents, and create handwritten documents using electronic ink for later reference or even conversion into text. Tablet computers can be placed into docking station such as one provided by the present invention at a desk to support larger monitors, network connection, keyboard, mouse, and other peripherals as known to those skilled in the art.

The tablet computer platform is more than a portable computer. The addition of both ink and speech as data sources for these devices means new solutions will extend the computing platforms in ways not easily replicated by mainstream notebook computers or handheld devices. Examples of these new solutions include signature authentication for document binding and paperless workflow, microphones for medical dictation directly into a tablet computer, electronic whiteboard software that allows the device to be an input device to a projector for real-time digital whiteboard usage, and many others.

BRIEF DESCRIPTION OF THE DRAWINGS

For a more complete understanding of the present invention and the advantages thereof, reference is now made to the following description taken in conjunction with the accompanying drawings in which like reference numerals indicate like features and wherein:

FIGS. 4A through 4F are a plan view of one data connector used in the present invention;

DETAILED DESCRIPTION OF THE INVENTION

Preferred embodiments of the present invention are illustrated in the FIGURES, like numerals being used to refer to like and corresponding parts of the various drawings.

The present invention provides a tablet computer that is received by a docking station. This docking station comprises a docking assembly operable to be positioned with three degrees of freedom, bearing a data connector that mechanically supports and interfaces with the tablet computer. A support member couples the docking assembly to an expansion base, wherein the base comprises a plurality of ports that can interface with a variety of peripheral devices or power supplies. These various ports are mounted to a printed circuit board contained within the expansion base. A flexible printed circuit (FPC) combines the signal pathways for the variety of ports, allowing the signal pathways to travel from the printed circuit board and to the data connector. The tablet computing device has a plurality of contact or touch points positioned on the right and left edges of the tablet to facilitate aligning the tablet to the docking assembly in either a landscape or portrait mode.

One embodiment is illustrated in FIGS. 1A–1B, and 2A through 2E. The tablet computer 10 aligns itself automatically and couples to the base assembly 12. This portable computing device comprises a tablet with a display screen/work surface 14. Tablet computer 10 may be operated in either a portrait or landscape mode and uses a touch sensitive screen to facilitate users interface with software applications. Tablet computer 10 may receive input in the form of handwritten notes, or electronic ink sampled by display screen/work surface 14, which also serves as a touch screen. This data is converted into commands or input for the various applications running within tablet computer 10. A series of function keys 16 allow direct access to various functions internal to tablet computer 10.

Base assembly 12 couples to tablet computer 10 in three-dimensional-space. This differs significantly from traditional docking/port replicator systems that operate in one specific plane or orientation. Standard docking systems, for laptops or personal data assistants (PDA), dock in a single orientation.

Figure 1A:
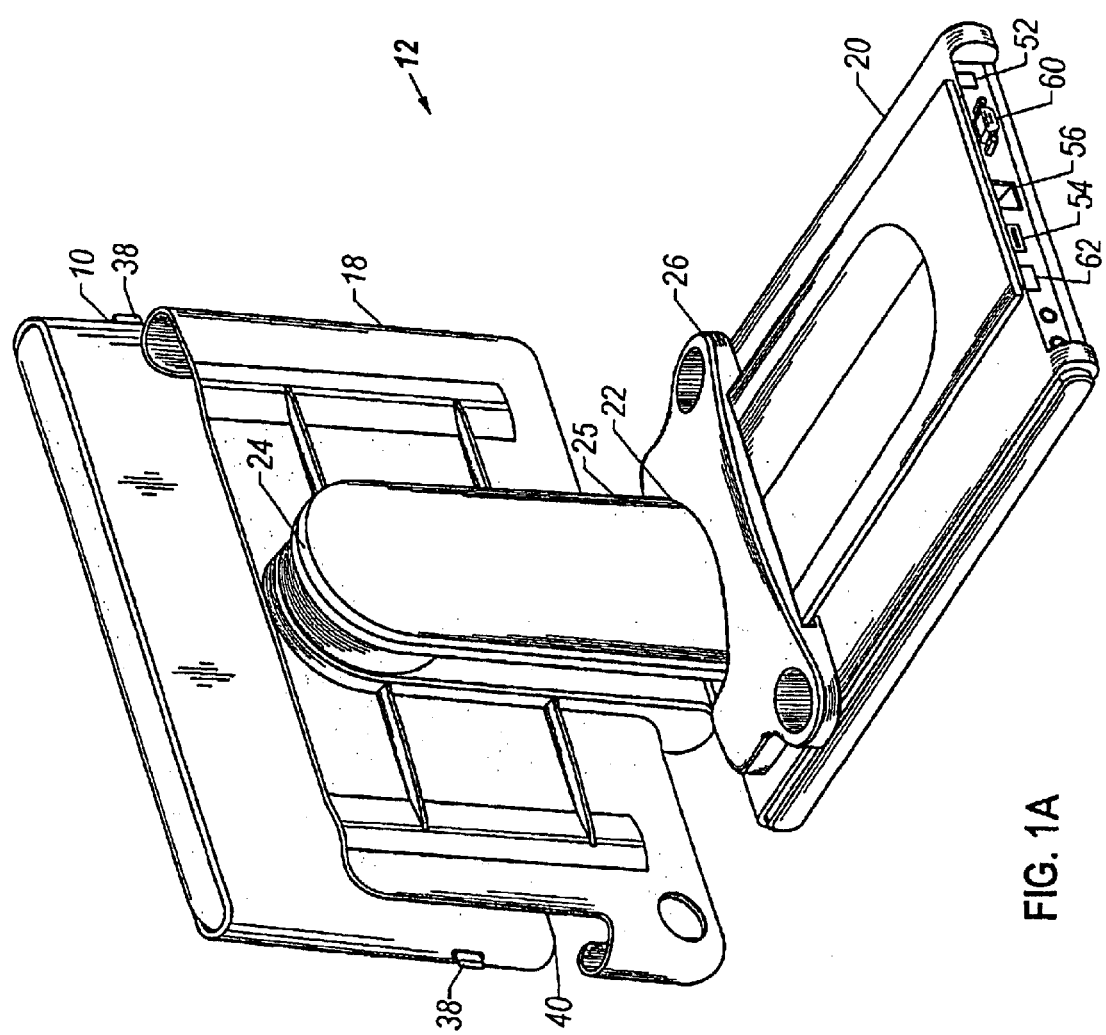
FIGS. 1A and 1B provide an isometric view of the extension base provided by the present invention.
Figure 1B:
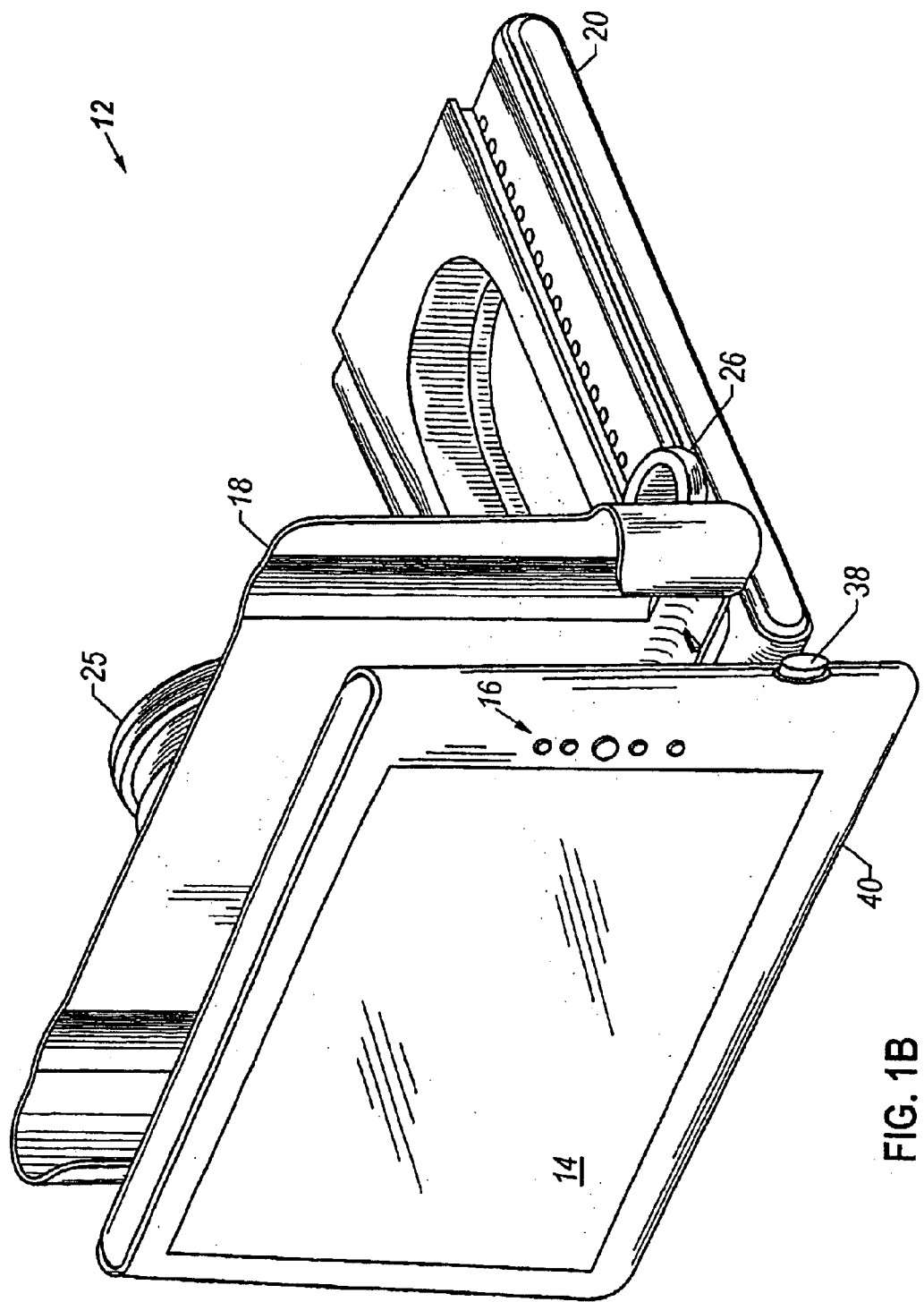

Base assembly 12 of the present invention, as shown, in FIGS. 1A and 1B receives tablet computer 10 with docking assembly 18. Docking assembly 18 is positioned with respect to base assembly 20 in three-dimensional space through a support member having at least two articulated joints. The articulated joints are isometrically shown in FIGS. 1A and 1B and in the vertical position in the plan views provided in FIGS. 2A–2E. The joints comprise a hinged joint 22 which allows docking assembly 18 to be positioned radially with respect to base assembly 20. Base assembly contains all the peripheral ports and may also provide a storage slot for a stylus used to interface with the slate or tablet computer. A second pivot joint 24 allows docking assembly 18 to rotate about pivot joint 24 in a local X-Y plane parallel to support member 25. Support member 25 flexes radially to allow docking assembly 18 to be positioned radially in a plane divergent from base assembly 20. By locating pivot joint 24 roughly at the center of tablet computer 10, the users may comfortably write or apply pressure on any portion of display screen/work surface 14. Furthermore, brace 26 provides firm support and restricts unwanted movement of support member 25, allowing tablet computer 10 to serve as a steady work surface. Support member 25 facilitates the touchscreen interface for the user by allowing users to adjust tablet computer 10 to any angle that the user finds comfortable. Hinged joint 22 may employ a light friction hinge to couple support member 25 to base assembly 20. This hinge may allow any angle of rotation. One embodiment allows up to 90° of rotation while another embodiments allows more than 90°. In particular, one embodiment allows motion of support member 25 from 0°–95°. This range allows tablet computer 10 to be rotated past or placed in a position past vertical to fulfill European monitor standards. These standards help address glare issues associated with monitors.

Pivot joint 24 allows docking assembly 18 to be rotated, with respect to support member 25. Thus tablet computer 10 can be quickly positioned in either a portrait or landscape mode. Software incorporated into the base assembly 20, or mechanisms incorporated into the docking assembly 18 support member 25, or tablet computer 10, may automatically direct that the display screen/work surface 14 be reoriented as tablet computer 10 is rotated 90 degrees. The device may automatically re-orient the display screen. One such mechanism used to detect this reorientation may comprise a switch located within the dock that realizes that the tablet computer 10 has been rotated, and results in tablet computer 10 re-orienting screen/work surface 14. This switch may not be dependent on local vertical, but will orient and re-orient based on the original position and location of tablet computer 10. This mechanism may be limited to only examining the rotation of pivot joint 24 to determine the orientation of the display. Other embodiments, may incorporate an angular detect, or a reference to local vertical to automatically orient screen/work surface 14. The device shown in FIGS. 1A and 1B uses a detect switch to determine any orientation change of 90 degrees.

Several unique features have been incorporated into tablet computer 10, base assembly 12 and docking assembly 18 in order to facilitate coupling computing tablet computer 10 to base assembly 12 in a dynamic three dimensional environment with plug and play capability.

The present invention addresses problems encountered in docking, tablet computer 10 to base assembly 12 in three-dimensional space that have not previously been addressed. Docking assembly 18 may be located at any angle from horizontal to vertical relative to the base assembly 20.

Further docking assembly 18 may be rotated 90 degrees relative to support member 25. The present invention couples these devices together while experiencing several degrees of freedom not normally addressed in docking computing devices to their cradles or docking units. The present invention also may dock tablet computer 10 in a portrait mode, landscape mode, and in either a horizontal or vertical plane, or any angle in between. Docking assembly 18 and touch points or contact points 38 located on the cases of tablet computer 10 allow the tablet to be docked in either mode. Furthermore, the present invention, when docked, facilitates the use of the tablet-computing device. The present invention permits orienting screen/work surface 14 in the landscape mode as a monitor, wherein base assembly 12 serves as a support for tablet computer 10 or in the portrait mode as a work surface.

By facilitating the docking of tablet computer 10 to docking assembly 18, users may mechanically "grab and go" with tablet computer 10. This is a significant feature when coupled with the ability to re-orient screen/work surface 14. Equally important is the ability to electrically plug-and-play or "grab and go."

In other instances, it may be desirable to automatically direct the tablet computer 10 to re-orient itself according to the orientation of docking assembly 18 relative to base assembly 20 upon docking.

The mechanisms used to detect and re-orient screen/work surface 14 do not necessarily automatically re-orient screen/work surface 14 when tablet computer 10 docks. Rather, in some instances it is preferred that screen/work surface 14 remain in its current orientation until a user specifies that that orientation be changed via function keys 16, or the rotation of docking assembly 18 about pivot joint 24.

Fundamental mechanics differentiates tablet computer 10 in landscape mode versus portrait mode. Docking assembly is oriented in the landscape mode, in FIGS. 1A and 1B, 2A–2E and 3. Another aspect, unique to the present invention is brace 26. Brace 26 holds upright support member 25. Historically products have used a kickstand like device to position the display in an upright position. This approach is inherently unstable, when the device is moved further from vertical. As the angle of the tablet departs vertical, the downward force is moved further and further away from the kickstand interface with the underlying horizontal surface. The brace provided by the present invention allows the work surface of tablet computer 10 can remain rigid when in a vertical or semi horizontal position. This is further aided by the fact that support member 25 couples firmly at the center of the tablet. A light friction hinge or other similar joint as is known to those skilled in the art may be used for hinged joint 22 to maintain the support arm in an upright or semi-upright position without the use of brace 26. However, brace 26 decreases the load placed on the fringe in an upright position.

Figure 2A:
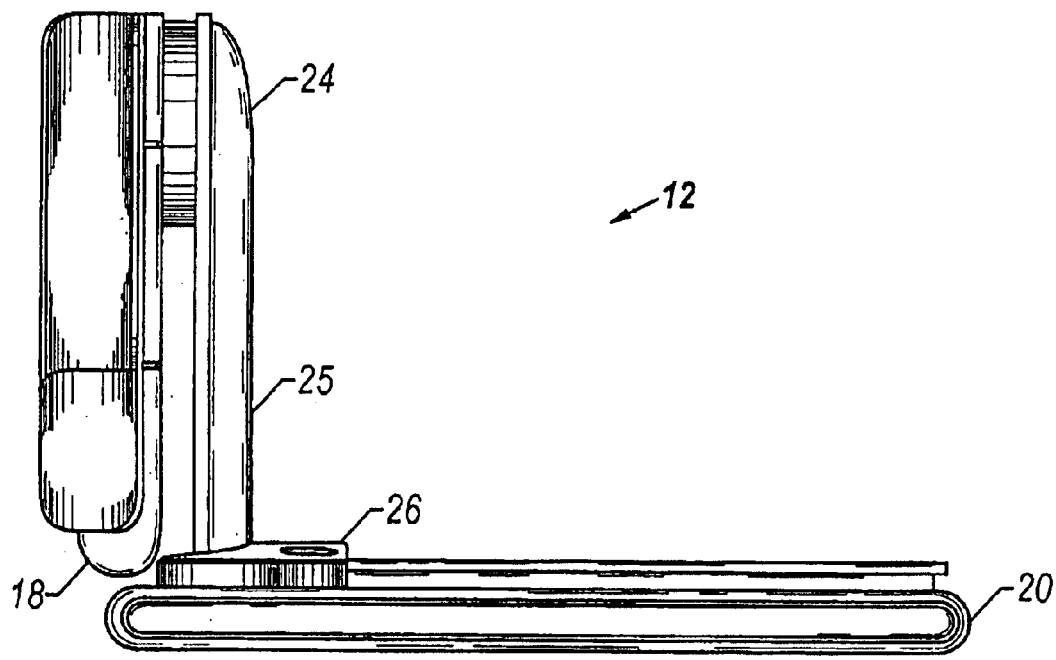
FIGS. 2A, 2B, 2C, 2D, and 2E provide plan views of the extension base.
Figure 2B:
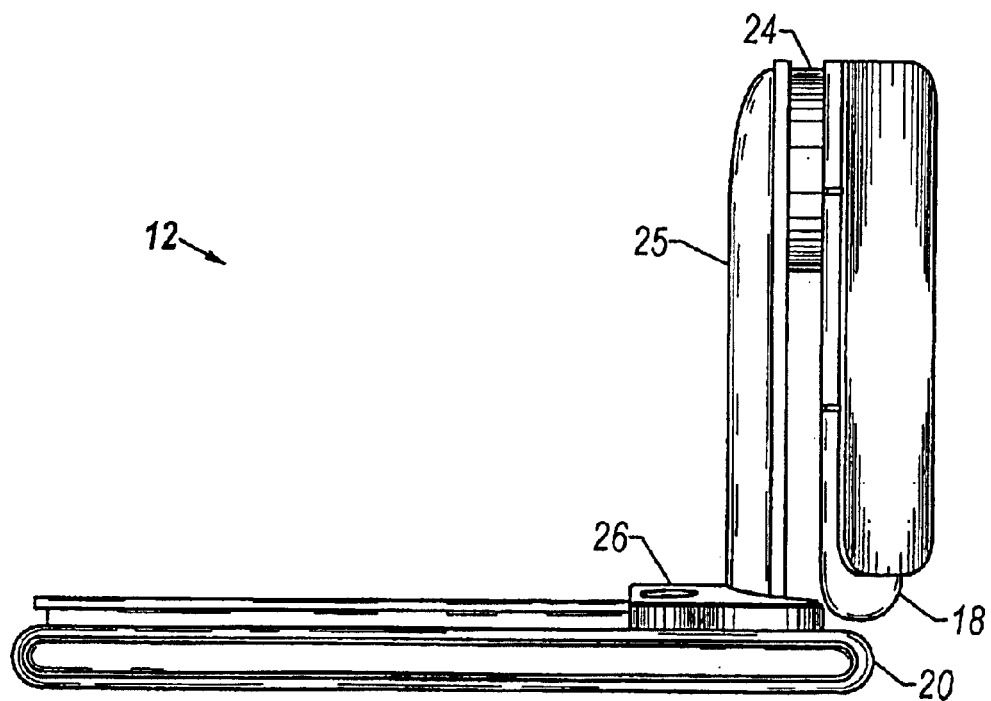
Figure 2C:
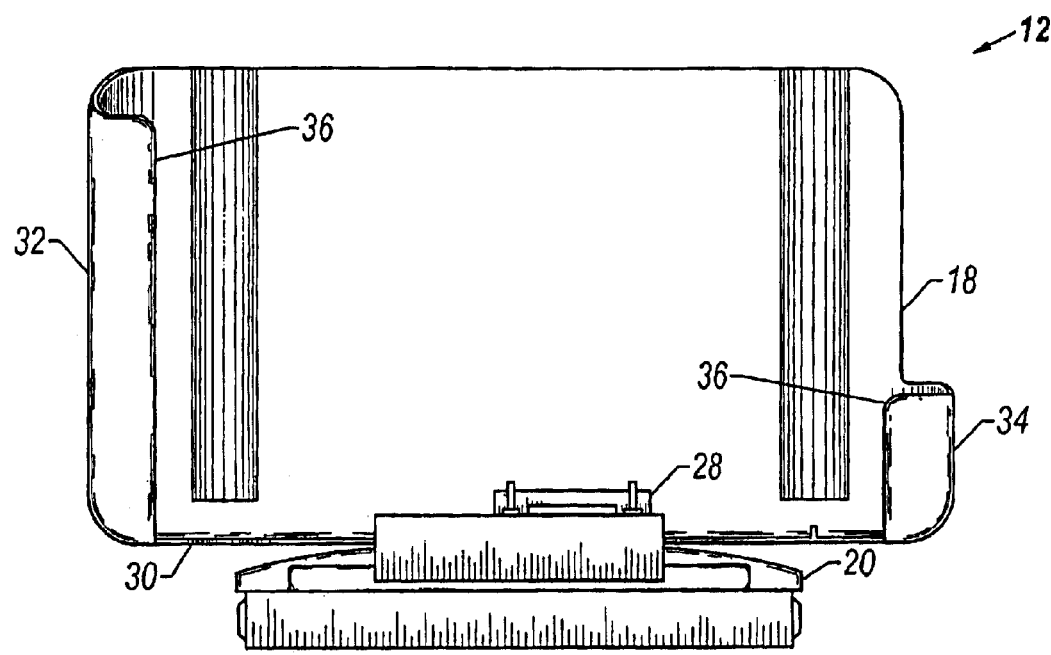
Figure 2D:
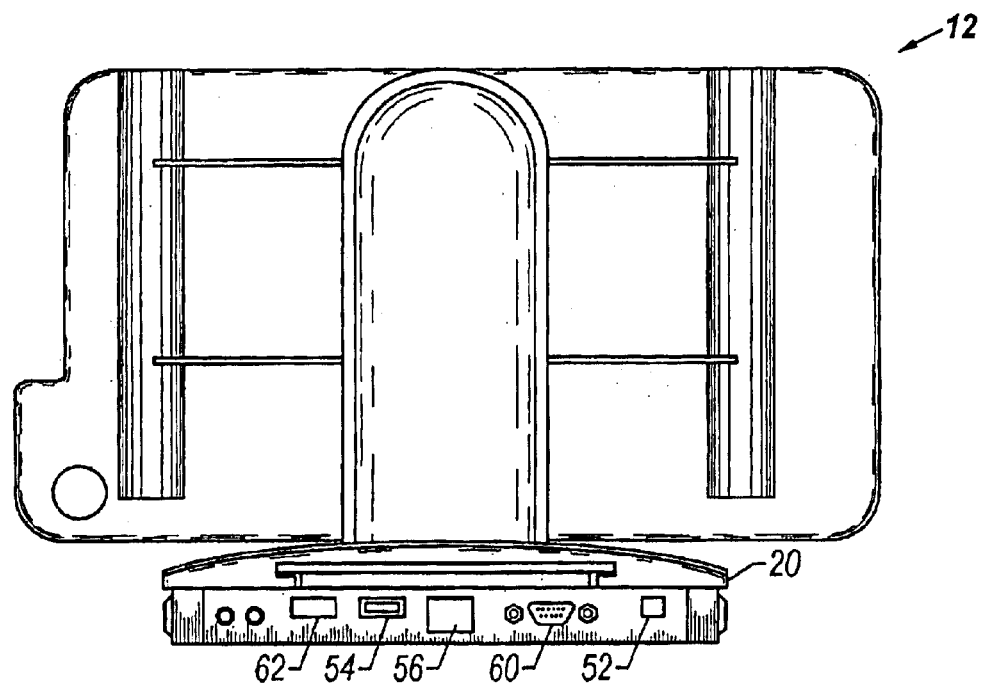
Figure 2E:
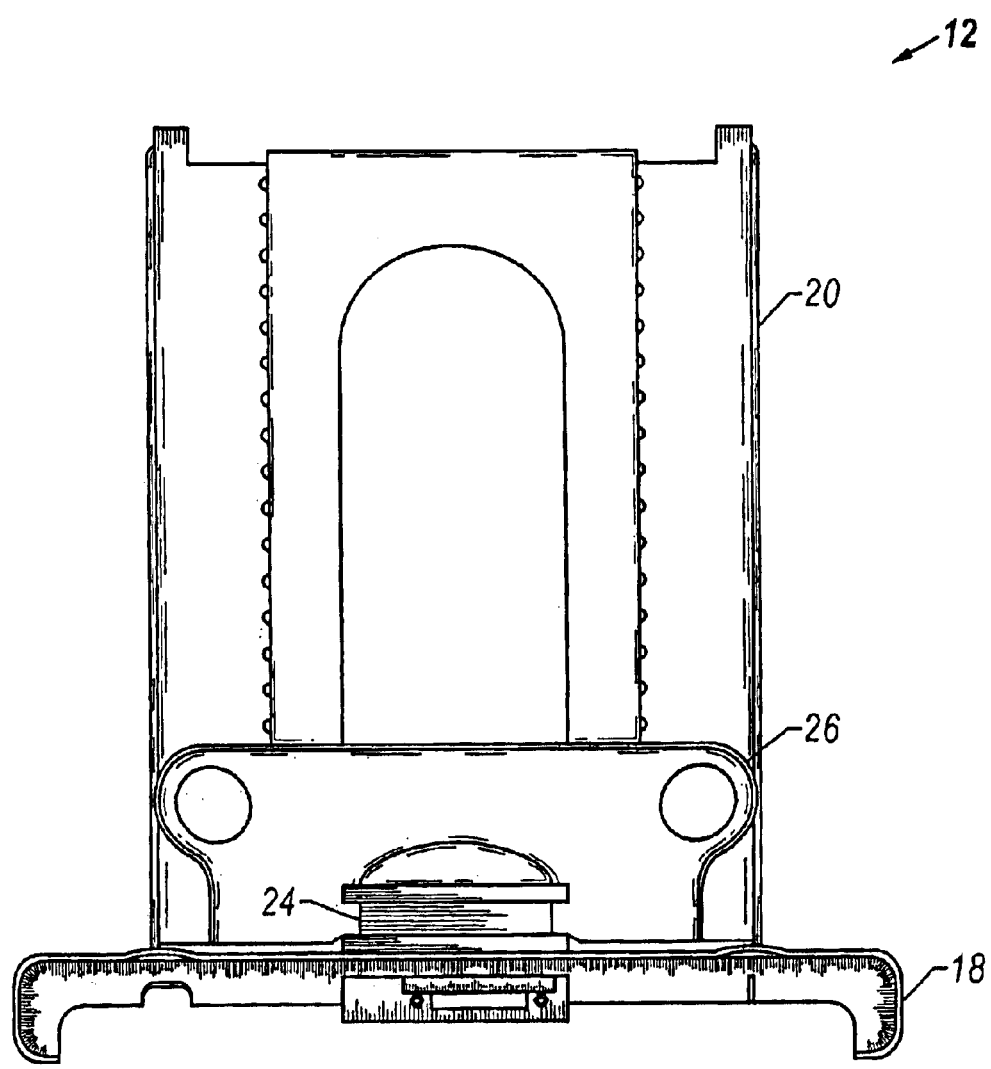
Figure 3:
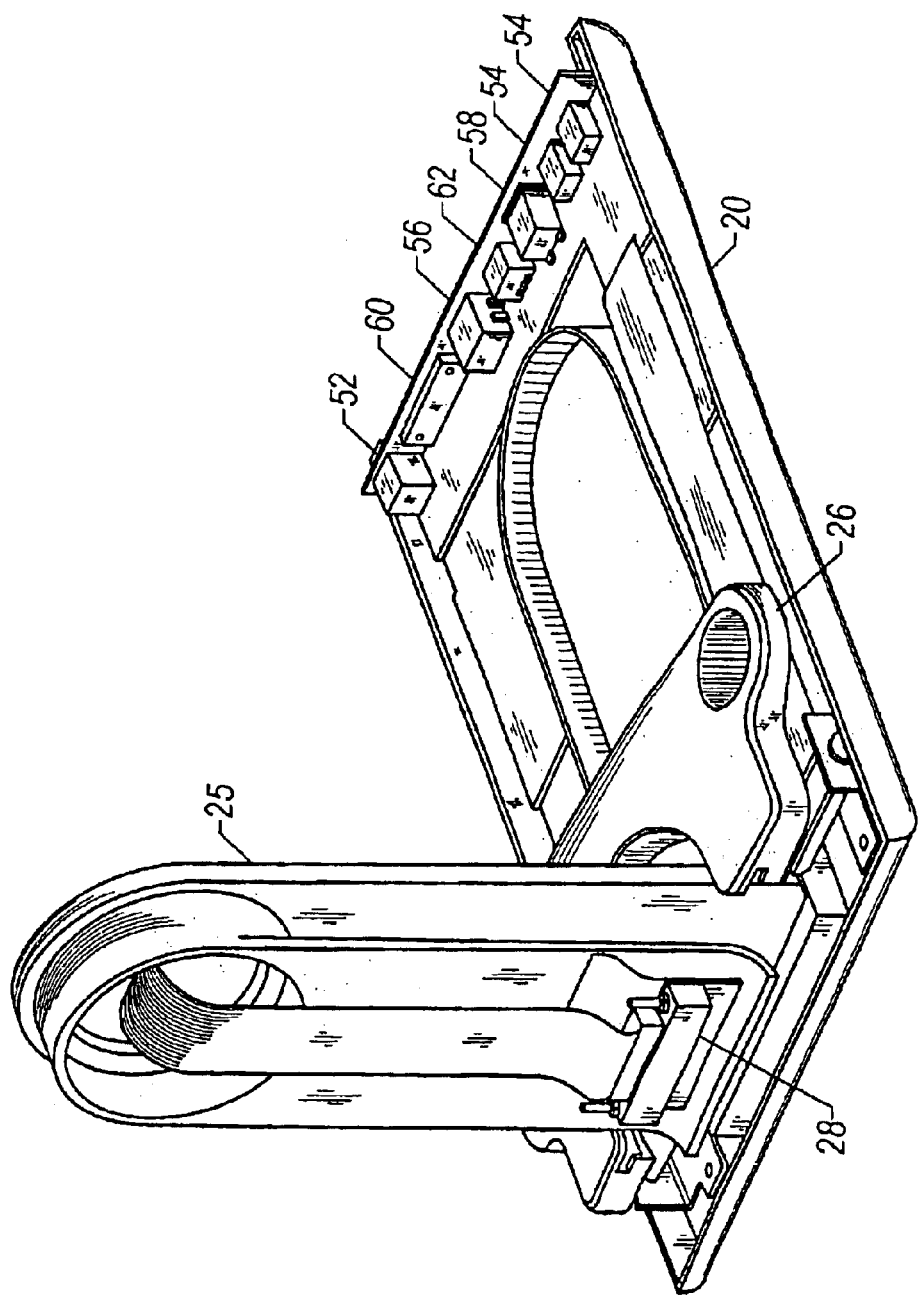
FIG. 3 depicts an isometric view of the extension base with the docking assembly cutaway.
Figure 4A:
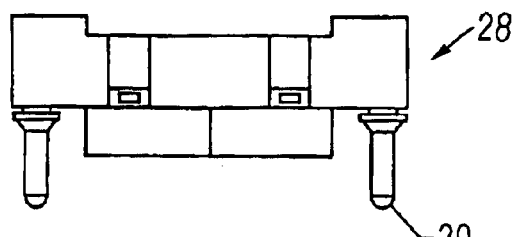
Figure 4B:
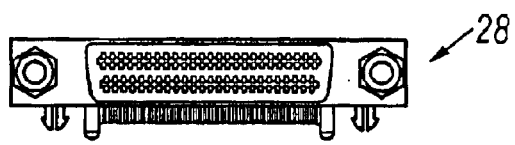
Figure 4C:
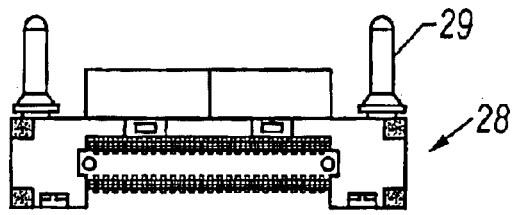
Figure 4D:
Figure 4E:
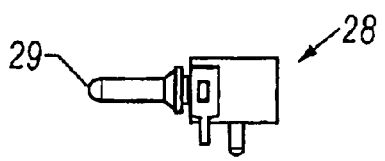

Referring now to FIG. 2C and FIG. 3, docking assembly 18 has been cutaway to reveal docking connector 28. In landscape, gravity pushes the tablet device against lower edge 30 and docking connector 28. Thus, gravity helps dock tablet computer 10 to docking assembly 18. In this orientation, one need merely control the computing device's horizontal motion to align the I/O port of the computing device to the docking connector 28. If the product is to be docked in a portrait mode, gravity no longer assists the connection between the I/O port of the computing device to data docking connector 28. Rather, gravity now pushes tablet computer 10 against left edge 32 of docking assembly 18, which is now in a horizontal position. This changes the stresses and support points associated with docking connector 28. Also changed are the reference points associated with making a successful dock. In portrait, the references are located off a different surface.

To dock tablet computer 10 to docking connector 28 in the portrait mode, reference is made to right edge 34 of tablet computer 10 and left edge 32 of docking assembly 18. This requires increased tolerances between the reference points along left edge 32. To facilitate this, tablet computer 10 has several contact points 36 along left edge 32 and right edge 34 of tablet computer 10. These contact points 36 may be changed in size and shape to account for internal tolerances of the overall construction of the individual pieces of tablet computer 10. Contact points 38 of tablet computer 10 are located as shown in FIG. 1B, on the left and right edge. These touch points account for the tolerances of various pieces to achieve a proper connection. These tolerances accumulate edge from the internal boards and other components comprising various fasteners, pads and the I/O connector of the computing device.

Contact points 38 adjust to account for the actual manufactured tolerances of the component pieces. The integrated tolerance are known when the parts are integrated. Adjustable contact points 38, compensate for the actual distribution of integrated tolerances of component pieces. The manufacture of the touch points is set at a repeatable height that accounts for the distribution of integrated tolerances. Therefore, the touch points provide a repeatable method and means for docking tablet computer 10 to docking assembly 18.

This concept when applied to the manufacture of plastic parts such as docking assembly 18, provides many benefits. Parts are typically repeatedly reproduced, but not accurately produced. Thus, the present invention accounts for the distribution of manufactured parts with the adjustable touch points. Thus, the present invention provides a significant improvement in the method of manufacture by relying on repeatability as opposed to accuracy. The integrated error associated with the tolerances of the component parts is compensated for at the end of manufacturing process as opposed to stressing the accuracy of each individual component manufacturing processes. This is achieved by taking the component parts and a statistical analysis of each component part determines the manufacturing distribution of the individual parts.

Mechanically, the touch points ensure that when tablet computer 10 enters docking assembly 18, no matter the orientation, tablet computer 10 aligns itself within the docking assembly 18. The lower touch points are located near the bottom edge 40 of tablet computer 10. These points are located at or near the lower edge, when to ensure that when tablet computer 10 enters docking assembly 18, that the lower contact points 38 contact the left and right edges of docking assembly 18 first. When the tablet is docked in a portrait mode, touch points still center the tablet within docking assembly 18. By centering the tablet, the mating of docking connector 28 to the I/O port of tablet computer 10 is facilitated.

The upper contact points 38 on the left side of tablet computer 10 becomes apparent when docking assembly 18 is rotated 90 degrees from a landscape to a portrait mode. After docking assembly 18 has been rotated, the critical contact points are on the left edge of tablet computer 10.

Efficient manufacture of docking assembly 18 and bottom edge 40 of the tablet demonstrates additional technical advantages of the present invention. However, it is extremely difficult to manufacture component pieces maintaining three-dimensional tolerances over a large production run. Reference points are not located on the front or back of the tablet. This is due to the fact that the depth of the device is much smaller when compared to the length or height of the computing device. Therefore, the tolerances and errors experienced in the depth of the device are much smaller than those experienced in either the width or height of the device. Errors associated with component pieces accumulate over large distances, in a molded plastic piece. The larger the component piece is, the larger the overall change of that component piece. Furthermore, the "L", "U", or "J" shaped channel is tapered to receive the tablet. It should be noted that there might be some concern that when a manufacturer's process is altered, that the statistical average of the produced component pieces may change, shifting the tolerances associated with that piece.

The process control tolerances of the tablet and touch points with respect to docking assembly 18 allow the I/O port of tablet computer 10 to be successfully located in close proximity, perhaps plus or minus 2 millimeters, of the docking connector 28. This ensures that the reception nuts of the I/O port assembly receive guide pins on docking connector 28.

That the method of manufacture of this product differs significantly from prior products in that previously one would specify the component pieces to the manufactured with exact tolerances. Now, although tolerances are specified, the fit is determined not by the tolerances, but the repeatability within those tolerances.

The manufacturing errors of the component parts is determined using statistical analysis of manufactured parts, then contact points compensate for the integrated error of all of the components to facilitate the connection while minimizing stress on the docking connector 28.

Although the present invention introduces many novel mechanical features, novel electrical features are also introduced. The present invention provides a significant advantage over prior existing systems in that a flexible print cable (FPC) provides a communication pathway or circuit between the various ports and functions associated with base assembly 20 and the docking connector 28. As shown in FIG. 3, the many functions of a notebook base, including the power input 52, USB ports 54 and 56, network connection 58, serial connection 60, and parallel port connection 62 are combined into a single FPC 64. Power inputs 52 through 62 are affixed to a printed circuit board 66 contained within the base. By mapping these signals to a single FPC, a plurality of individual wires and their inherent complexity from individual ports to docking connector 28 are eliminated. FPC 64 is capable of carrying DC power, VGA, USB, digital audio, analog audio, Ethernet, IEEE 1394, and other data signals as known to those skilled in the art. A storage slot for an interactive stylus with a reminder function to return the stylus to the base based on an auto detect of the stylus may be incorporated into the base.

FIGS. 4A, 4B, 4C, and 4D provide various views of one embodiment of docking connector 28. Docking connector 28 mates with the I/O port of tablet computer 10. To facilitate docking in a variety of positions, the I/O port is mounted directly to bottom edge 40 of tablet computer 10. Guide pins 29 help align data connector to the I/O port. This further helps to eliminate errors and tolerances associated with the manufacturer of the internal component pieces contained within the tablet. This further eliminates integrated errors of components of the data connector to fasteners, which in turn couple the data connector/fastener combination to a maze of internal components each having its own specific tolerances.

For weight and strength purposes, bottom edge 40 may be manufactured from magnesium or other similar materials as is known to those skilled in the art. Magnesium provides the required strength and lightweight properties for the frame of the tablet.

Although the docking assembly 18 is shown in an L or J shape, it is conceivable to use a U-shape as well. The embodiment shown in FIGS 1A–1B, uses the "L" shape for docking assembly 18. This is repeated in FIGS. 2A–2E. Although a U-shape could be utilized, the second upright of the U-shaped docking assembly, may potentially cover functions keys located on one upright edge of the tablet. Furthermore, the rotation of hinged joint 22 is limited to 90 degrees with an L-shaped assembly, while 180 degrees of rotation are possible with a U- or J-shaped assembly. Support for the computing device at other angles is allowed with a J- or U-shaped docking assembly.

In other embodiments, tablet computer 10 may dock with a docking assembly 18 that is coupled to port mechanism coupled to a support member, wherein the support mechanism is directly mounted to a horizontal or vertical surface, thus allowing a wall mounted docking assembly.

Figure 5:
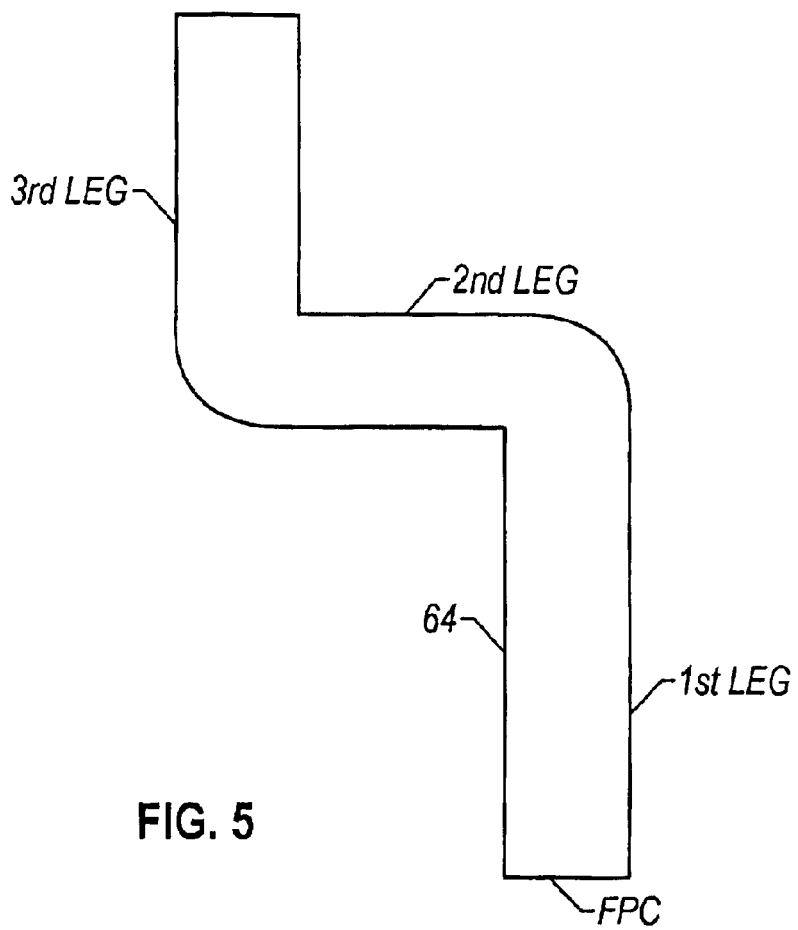
FIG. 5 is a two-dimensional outline of the flexible printed circuit (FPC) used in the present invention.
Figure 6:
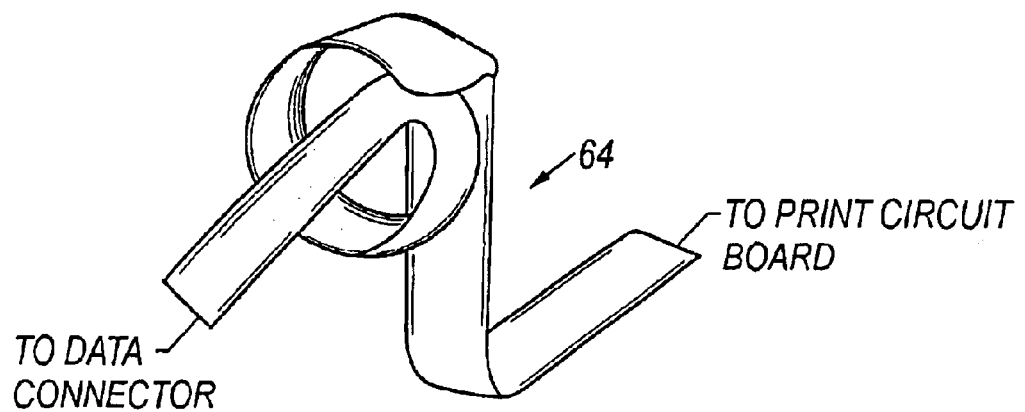
FIG. 6 provides an isometric view of the FPC within the dock.

FPC 64 allows these signals to traverse a tortuous path. Slack along the primary axis of the FPC allows FPC 64 to traverse hinged joint 22. A more complex solution may be required in order to allow docking assembly 18 to rotate about pivot joint 24. A two dimensional view of one possible layout of this FPC is provided in FIG. 5. FIG. 6 provides a view of FPC 64 in three dimensions wherein docking assembly 18 (FIG. 1A), pivots about pivot joint 24 (FIG. 1A), without placing tear stress on FPC 64.

Referring to FIG. 1A, at pivot joint 24, the primary axis of the FPC turns 90 degrees with FPC 64 to form the second leg. A second bend of 90 degrees connects the second and third legs of the FPC. To allow docking assembly 18 to rotate 90 degrees the second leg is folded back in a cylindrical form wherein no tear stresses are associated with rotating docking assembly 18. When docking assembly 18 is rotated, slack is merely taken in or out of the cylinder or spiral formed by the second leg of FPC 64. The cylinder may change from 360 degrees to 270 degrees or any other incremental change of 90 degrees, preventing any tearing stresses. Tearing stresses would be perpendicular to the signal pathways along the first, second or third legs of FPC 64.

Figure 7A:
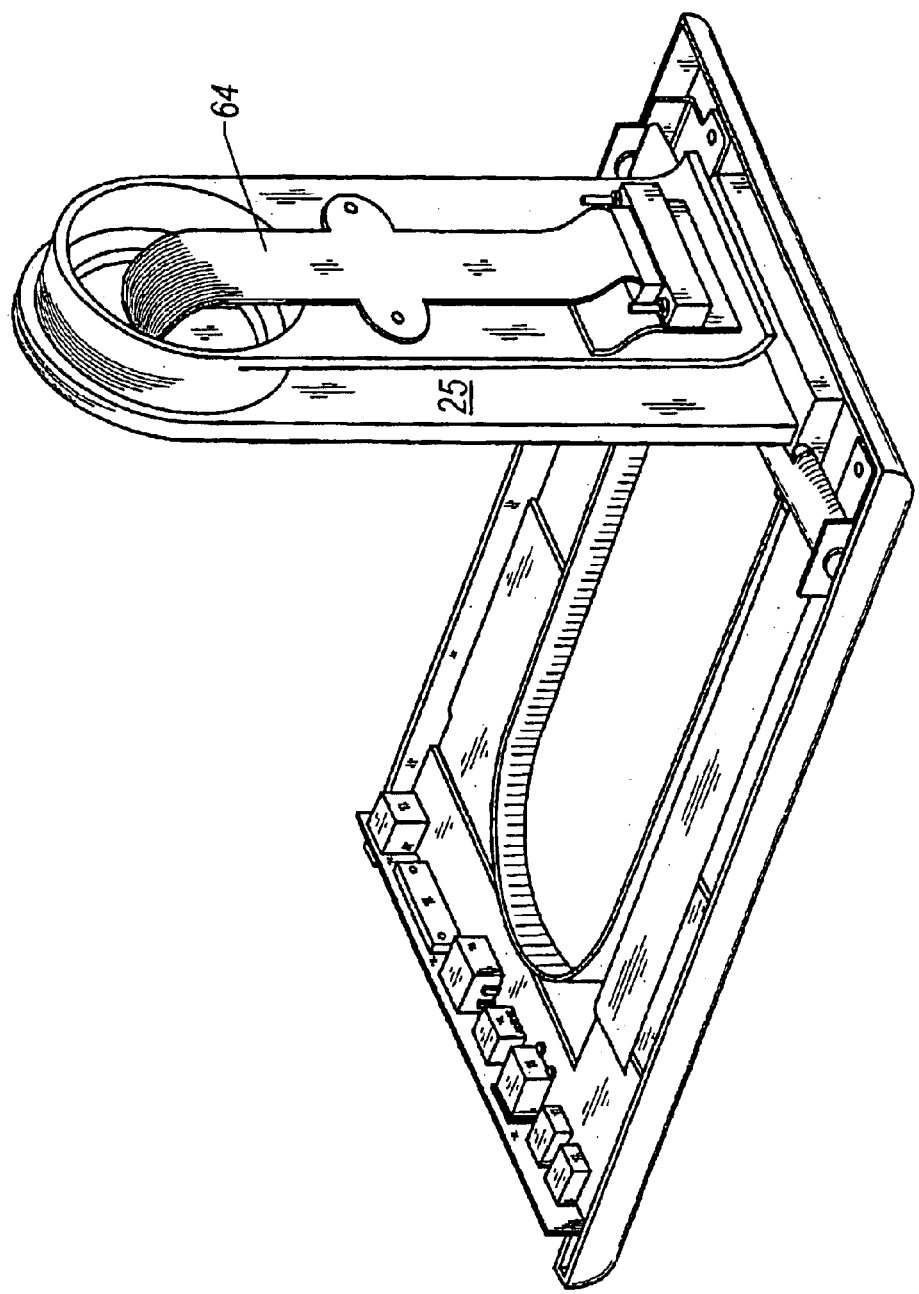
FIGS. 7A, 7B, and 7C, depict a second embodiment for the layout of FPC within the support member.
Figure 7B:
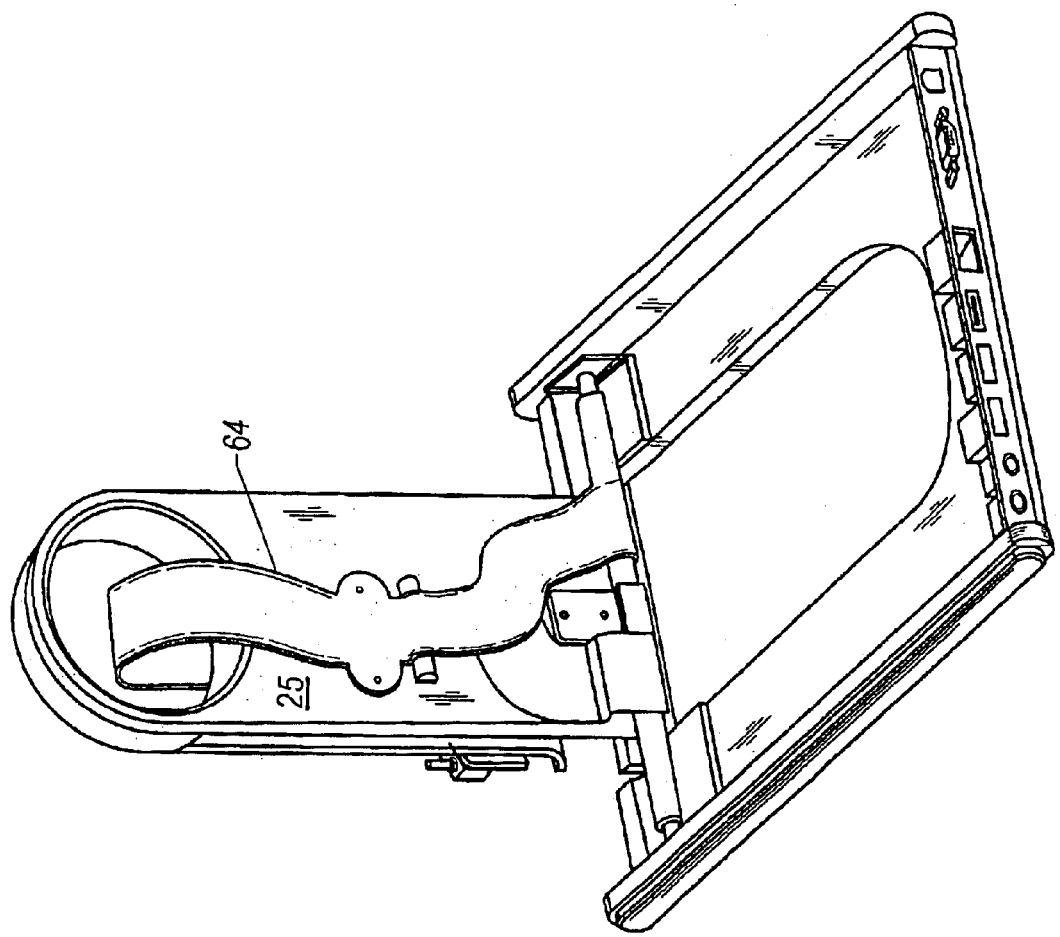
Figure 7C:
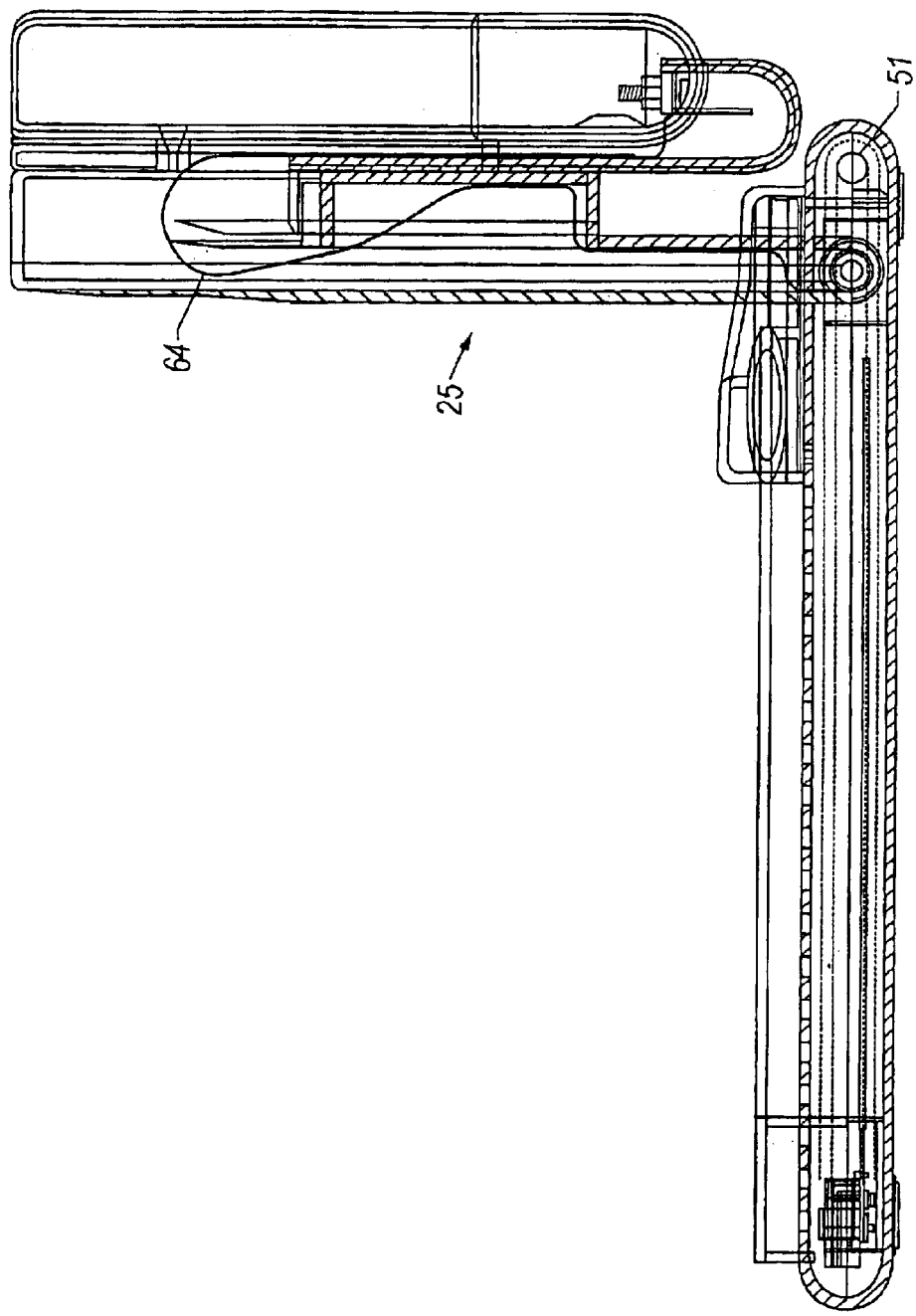
Figure 8:
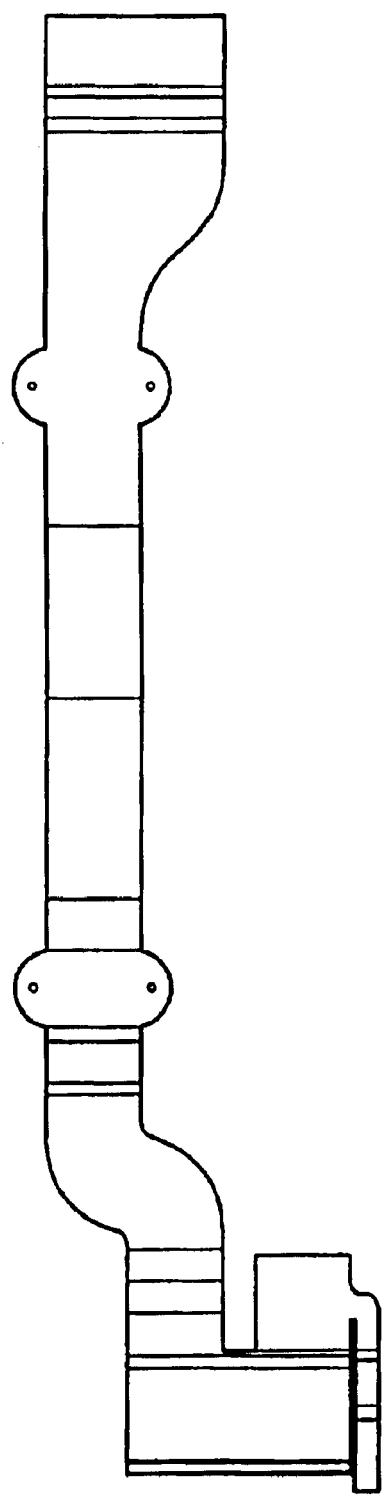
FIG. 8 provides a two-dimensional outline of an additional embodiment of FPC within the present invention.

Alternatively, an enlarged cavity may be formed in the support member 25. This is illustrated in FIGS. 7A, 7B, and 7C. Here the flex is rigidly attached to the front and back interior of support member 25, thus allowing the flex path cross-section illustrated in FIG. 7C to not be restricted by the interior free space within the support member. The observed flex cross-section change may be minimized by minimizing the horizontal separation between the flex rigidly attached to the front of the support member and the flex rigidly attached to the back interior cavity of the support member. Thus, the FPC geometry shown in FIGS. 5 and 6 may be simplified to the two-dimensional layout of FIG. 8. Additionally, a slot 51 for an extra stylus that does not interfere with the internals of base assembly 20 is shown in FIG. 7C.

Electrically, FPC 64 allows several high speed data signal pathways such as fire wire, LAN, digital audio, analog audio, Ethernet, IEEE 1394, USB, as well as AC or DC power signals to be combined on a single FPC. Other solutions, such as a radio or wireless dock are currently constrained by the bandwidth. FPC meets the requirements of the various high-speed data connections. Furthermore, FPC, provides more security than is provided by wireless applications.

Incorporating FPC into a hinge is known to those skilled in the art and is commonly done with notebook displays. The use of FPC greatly simplifies and enhances the electrical problems encountered by the docking base unit associated with the present invention. The use of FPC allows for the present invention to meet EMI requirements, USB 2.0 requirements, both with high quality signals that are potentially better signal qualities than that of conventional wire.

By manipulating the geometry of the FPC, one is able to achieve the same connections that would require by twisting a great number of individual wires without any twisting action. Rather, the FPC flexes as it was designed to flex. FPC provides a straight run for the signal pathways associated with powering and transferring information, high-speed information, at a high data rate.

Challenges exist in mapping these various low and high frequency signals within a single FPC.

Figure 9:
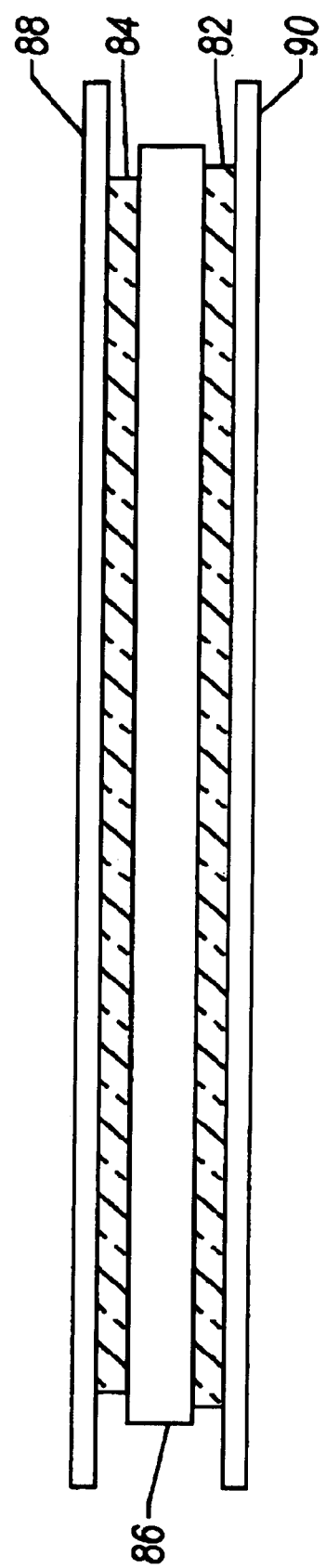
FIG. 9 provides a cross-sections of a FPC.
Figure 10A:
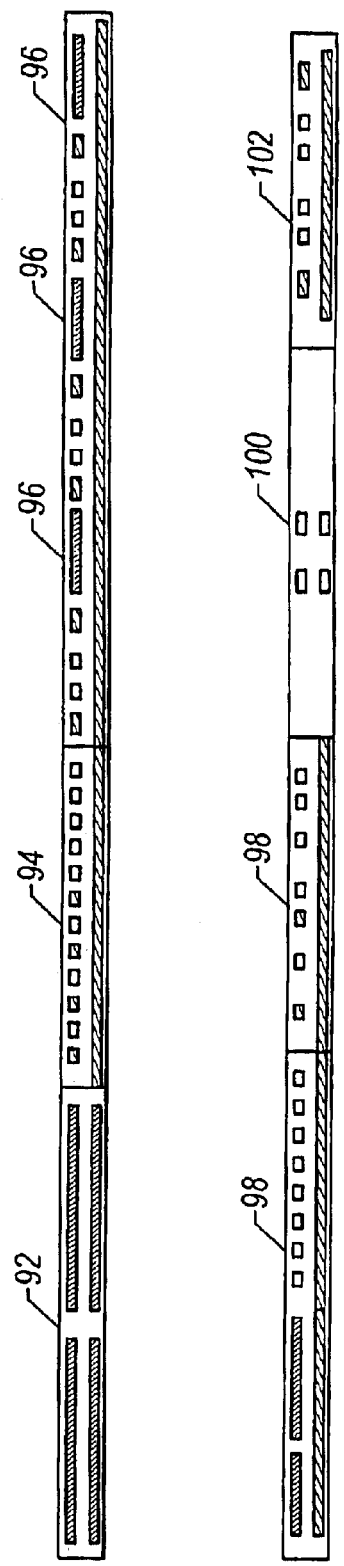
FIGS. 10A and 10B provide cross-sections of FPC used by the present invention with various signal traces.
Figure 10B:
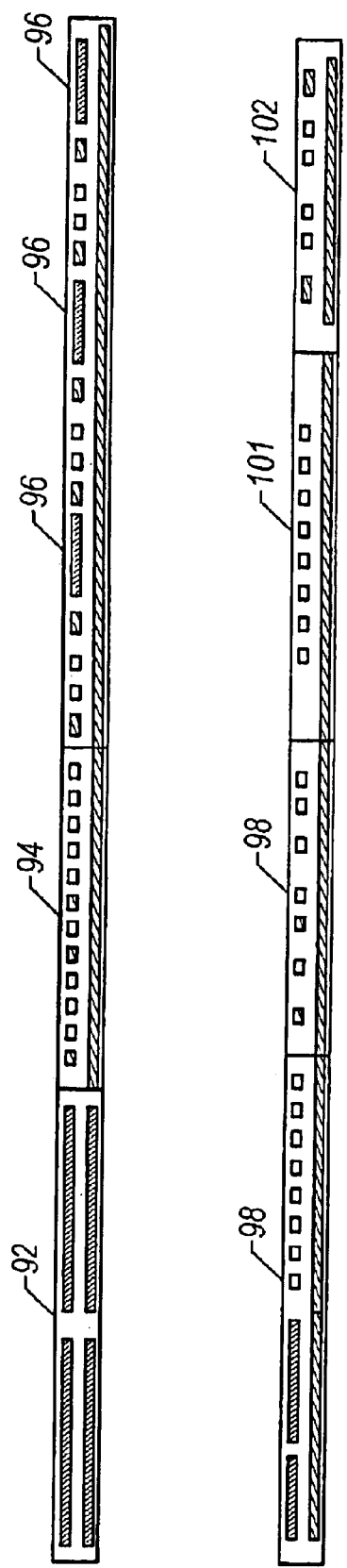

One potential cross-section of FPC is illustrated in FIG. 9. This FPC circuit comprises a poly layer or dielectric sandwiched between two copper layers within two polyimid substrates. In this case ground layer 82 and circuit layer 84 lie on either side of insulating layer 86. Ground layer 82 and circuit layer 84 may be referred to as a one-ounce, three-quarter ounce, or one-half ounce copper layer. This means that for a one-ounce FPC, one-ounce of copper is deposited on one square foot of FPC. Thinner copper layers provide increased flexibility, but also increased resistance. The outer layers, 88 and 90, comprise an upper and lower layer of poly that encloses the copper and dielectric sandwich. Ground layer 82 and circuit layer 84 may be etched using photolithography or other such methods known to those skilled in the art. Both the grounds and the data pathways may be patterned to present cross talk between signals. Insulating layer 86 may be polyester based dielectric, which serves as an insulator between the circuit pathways and the grounds. In the cross-sectional layout illustrated in FIGS. 10A and 10B DC pathways are provided as power trace 92. VGA trace 94 is provided immediately to the right of the DC power trace 92. To the right of the VGA pathway are three high frequency USB connections with the appropriate USB traces 96, followed by a digital audio pathway and associated trace 98. A LAN data bus pathway 100, an IEEE 1394 trace 102 are also provided.

By minimizing the thickness of the different copper dielectric and poly layers the flexibility of FPC is increased. Increased flexibility allows FPC 64 to conform to tighter radius joints as the tension and compression across the height of FPC 64 is reduced as the height of FPC 64 itself is reduced. In some areas, it may be necessary to reduce the thickness of FPC 64 in tight radiuses or other torturous physical pathways. This is achieved by reducing the thickness of the copper layers from a one ounce to a three-quarter or one-half ounce copper layer. In some instances, the copper itself may be replaced by silverinc or other like materials to provide additional flexibility by reducing the thickness. In so doing an increased resistance from copper is incurred. Alternatively the conductive ground layer may be transformed from a solid continuous layer to a matrix or lattice with increased flexibility.

To increase the quality of the signals within FPC 64, separation zones 104 separate signal traces. Active signals are not placed in such proximity to each other as to cause cross talk between the signals. Furthermore, the DC power supply is separated from the high frequency data pathways such as the IEEE 1394 trace 102 in order to minimize contamination of the DC signal used by all systems within the tablet computer 10. This is one example of how the different electronic signals may be arranged on FPC 64 with the understanding that the methodology is to determine and understand the separation zones required for the different signal traces such that the signal traces and grounds may be horizontally separated to prevent contamination between the different signals.

Although the present invention has been described in detail, it should be understood that various changes, substitutions and alterations can be made hereto without departing from the spirit and scope of the invention as described by the appended claims.

What is claimed is:

1. A flexible printed circuit pathway, comprising:
   a first leg of flexible printed circuit oriented in a first plane, wherein signal traces within said first leg run parallel to said first leg of flexible printed circuit;
   a second leg of flexible printed circuit, wherein signal traces within said second leg run parallel to said second leg of flexible printed circuit;
   a first bend, coupling said first leg to said second leg and wherein signal traces within said first bend curve to match a curvature of said first bend;
   a third leg of flexible printed circuit oriented in a second plane, wherein signal traces within said third leg run parallel to said third leg of flexible printed circuit;
   a second bend, coupling said third leg to said second leg and wherein signal traces within said second bend curve to match a curvature of said second bend; and
   a spiral object formed by said second leg, wherein said second plane twists about a center of said spiral object without placing a tearing stress on said flexible printed circuit.

2. The flexible printed circuit of claim 1, wherein said first leg and/or third leg comprise at least one elbow, wherein said elbow divides said first leg and/or third leg into at least two sections oriented in different planes.

3. The flexible printed circuit of claim 2, wherein a section of said third leg is oriented in a plane parallel to a section of said first leg, and wherein said third leg rotates within said plane parallel to a section of said first leg by twisting said spiral object.

4. The flexible printed circuit of claim 1, further comprising electrical connectors coupling said signal traces on said first and third legs to external circuits.

5. The flexible printed circuit of claim 1, wherein said signal traces carry a plurality of signals selected from the group consisting of: DC power, AC power, VGA, USB, analog audio, digital audio, analog video, digital video, LAN, WAN, and IEEE 1394.

6. The flexible printed circuit of claim 1, wherein separation zones between said signal traces prevent cross-contamination of signals.

7. The flexible printed circuit of claim 1, wherein said flexible printed circuit comprise:
   a lower and upper poly layer that sandwich a ground trace layer and signal trace layer electrically separated by an insulating layer.

8. The flexible printed circuit of claim 1, wherein said ground trace layer and signal trace layer comprise 1 oz, ¾ oz, or ½ oz copper.

9. The flexible printed circuit of claim 2, wherein said ground trace layer and signal trace layer thin locally to increase said flexible printed circuits flexibility.

* * * * *